Nov. 9, 1965 L. J. TUMMERS 3,217,214

TRANSISTOR FOR SWITCHING OPERATIONS

Filed Jan. 25, 1961

INVENTOR

LEONARD J. TUMMERS

BY Frank R. Jifani

AGENT

United States Patent Office 3,217,214

Patented Nov. 9, 1965

3,217,214

TRANSISTOR FOR SWITCHING OPERATIONS

Leonard Johan Tummers, Eindhoven, Netherlands, assignor to North American Philips Company, Inc., New York, N.Y., a corporation of Delaware Filed Jan. 25, 1961, Ser. No. 84,923

Claims priority, application Netherlands, Jan. 29, 1960, 247,902

2 Claims. (Cl. 317—235)

Figure 1:
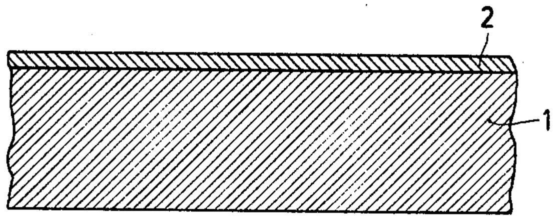

This invention relates to a transistor particularly intended for switching purposes, which transistor consists of a disc of semi-conductive material, of which one of two opposite main surfaces is provided with a collector contact, in which material a collector-base junction prevails.

One of the restrictions inherent in switching currents by means of such transistors with respect to the reduction of the switching periods consists in a frequently used arrangement in that the change-over from one switching condition to another is delayed by transition phenomena. In the "on" condition, the "on"-condition currents flow through the junction between the base and the collector in the forward direction, which results in a strong injection of charge carriers into the semi-conductive collector material. Before the opposite switching condition the "off" condition, can be attained, these charge carriers have to be removed.

With crystal diodes, which may exhibit the same effect, it is known to suppress this effect by using semi-conductor material having one or more active impurities reducing the lifetime of the charge carriers, to which end particularly iron, nickel, copper and gold are used in the case of germanium. A similar use of this measure with transistors is, however, not possible without the need for further means since the amplification factor of a transistor usually decreases with a reduction of the lifetime of the charge carriers in the semi-conductor material. A further disadvantage inherent in the said measure consists in that the collector leakage current increases.

The invention is based on the idea that it is possible to construct a disc of semi-conductor material from two parts consisting of materials of different properties, while in one of them a short lifetime of the charge carriers can be attained without the collector leakage current attaining inadmissible values.

In accordance with the invention, the disc of semiconductor material is built up from two layers of different materials, of which the relative boundary substantially coincides with the collector-base junction, the layer adjacent the collector contact, i.e. the collector layer, having a shorter lifetime for the charge carriers than the other layer, the base layer, while the band gap of the material in the collector layer exceeds that of the material of the base layer.

It should be noted that the terms "collector layer" and "base layer" serve to distinguish semi-conductor parts of different lifetimes and band gaps and are not to be mixed up with the terms emitter zone, base zone and collector zone, which indicate semi-conductor parts of different conductivity type.

The term "the boundary between the collector layer and the base layer substantially coincides with the collector-base junction" is to be understood to mean herein that the said boundary coincides with the junction or that it is located at the side of the junction near the collector contact at a distance which is at the most equal to the diffusion length of the charge carriers in the base layer, this distance being preferably smaller than the thickness of the base zone. When this condition is fulfilled, a lower collector leakage current will be obtained owing to the difference in band gaps.

As stated above, this lower collector leakage current provides the possibility of reducing the lifetime of the charge carriers. The base layer may, for example, be made from germanium having a forbidden band gap between its valence and conduction bands of 0.72 ev. and the collector layer may be made, for example, from silicon having a band gap of 1.12 ev. or from a semi-conductive compound, for example gallium arsenide (GaAs; 1.35 ev.), gallium phosphide (GaP; 2.25 ev.) indium phosphide (InP; 1.25 ev.) or aluminum antimonide (AlSb; 1.52 ev.). A method to be used preferably in accordance with the invention for the manufacture of such a transistor consists in that the base layer is caused to grow on the collector layer; it may be applied to the collector layer, for example, by vaporisation.

The invention will now be described more fully with reference to one embodiment which is illustrated in the drawing.

The figures show diagrammatically sections of a transistor in various stages of the manufacture on an enlarged scale, particularly the thin layers and zones are shown on an exaggerated scale.

The starting product is a plate of silicon 1 of p-type conductivity having a thickness of 50$\mu$, a resistivity of 0.001 ohm cm. and a lifetime for the charge carriers of $1 \times 10^{-9}$ sec., which material may form the collector layer. The lifetime of this material may be degraded by addition of killers such as gold to a content of $10^{16}$ at./cm.$^3$ and/or by a suitable quenching of the material from about 1000° C. to room temperature.

In known manner, not essential to the invention, a layer of germanium 2 of 3$\mu$ in thickness is applied to this plate by vaporisation; this layer, which also has p-conductivity owing to doping with indium, has a resistivity of 2 ohm cm. The lifetime of the charge carriers amounts to 0.1 $\mu$sec.

Figure 2:
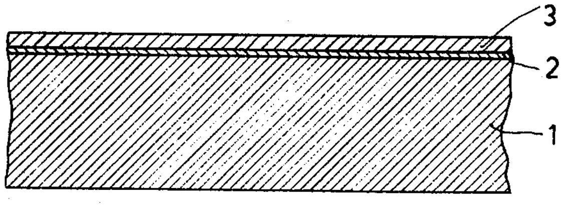

Then the plate is converted superficially by a diffusion treatment in antimony vapour (pressure $1 \times 10^{-4}$ mm. Hg) for 4 hours at 600° C. to a depth of 2$\mu$ into n-type material. The surface layer 3 is then removed by etching from the lower side of the plate. The result is illustrated in FIG. 2. From this plate discs 4 of 2 x 2 mms. are cut from this plate from which transistors are made.

Figure 3:
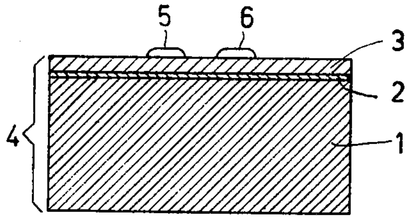

To this end each disc is provided by vaporisation with an emitter contact 5 of 150 x 25$\mu$ of aluminum, and a base contact 6 of the same size of gold. The contacts 5 and 6 are located parallel to each other and side by side at a distance of 15$\mu$ (see FIG. 3). During vaporisation the germanium is kept at a temperature of 300° C. in vacuum.

Figure 4:
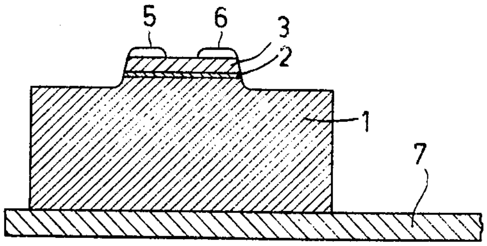

By masking and etching, the semiconductor material surrounding the contacts 5 and 6 is then removed to a depth of 8$\mu$, so that a transistor of the known "mesa"-type is obtained, which finally is fastened by means of tin to a nickel collector contact 7 (see FIG. 4).

In the present case the collector layer is thus formed by the part 1 and the base layer by the parts 2 and 3. The collector-base junction is located between these parts 2 and 3 at a distance of 1$\mu$ from the material of the collector layer 1. This distance is sufficiently small to obtain a reduction in the leakage current, taking into account that the diffusion length of the electrons in the germanium applied by vaporisation is about 20$\mu$.

The emitter zone is not shown in the drawing; the base zone is formed by the diffused part 3 and the collector zone by parts 1 and 2.

What is claimed is:

1. A transistor adapted for switching purposes, comprising a semiconductive wafer containing emitter, base and collector zones, said base and collector zones forming a collector-base junction, said collector zone up to the near vicinity of the collector-base junction being constituted of a first semiconductive material having a relatively short lifetime for charge carriers therein and a relatively large forbidden gap between its valence and conduction bands, said collector zone further including a thin layer contiguous to the collector-base junction and being constituted of a second semiconductive material having a relatively long lifetime for charge carriers therein and a relatively small forbidden gap between its valence and conduction bands, said thin layer of the collector zone having a thickness at the most equal to a diffusion length for the charge carriers in the base zone, said base zone also being constituted of the said second semiconductive material.

2. A transistor as set forth in claim 1 wherein the thickness of the thin layer of the collector zone is less than the thickness of the base zone.

References Cited by the Examiner

UNITED STATES PATENTS

| | | | |
|---|---|---|---|
| 2,813,233 | 11/57 | Shockley | 317—235 |
| 2,840,494 | 6/58 | Parker | 148—1.5 |
| 2,964,689 | 12/60 | Buschert et al. | 317—235 |
| 2,966,434 | 12/60 | Hibberd | 317—235 |
| 2,968,751 | 1/61 | Mueller et al. | 317—235 |
| 2,983,633 | 5/61 | Bernardi et al. | 317—235 |
| 3,057,762 | 10/62 | Gans | 317—235 |

OTHER REFERENCES

Transistors: Theory and Applications, by Coblenz and Owens, McGraw Hill, New York, 1955, page 262.

Properties of Elemental and Compound Semiconductors (Metallurgical Society Conferences, Boston 1959), published by Interscience Publishers, New York and London, copyright 1960, pages 26, 58, 67.

DAVID J. GALVIN, *Primary Examiner.*

SAMUEL BERNSTEIN, GEORGE N. WESTBY, *Examiners.*